US006933254B2

(12) United States Patent
Morita et al.

(10) Patent No.: US 6,933,254 B2
(45) Date of Patent: Aug. 23, 2005

(54) PLASMA-RESISTANT ARTICLES AND PRODUCTION METHOD THEREOF

(75) Inventors: Kenji Morita, Aichi (JP); Hiroko Ueno, Kanagawa (JP); Haruo Murayama, Aichi (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 13 days.

(21) Appl. No.: 10/298,529

(22) Filed: Nov. 19, 2002

(65) Prior Publication Data

US 2003/0215643 A1 Nov. 20, 2003

(30) Foreign Application Priority Data

Nov. 20, 2001 (JP) ....................................... 2001-354022

(51) Int. Cl.[7] .................................................. C23F 1/00

(52) U.S. Cl. ....................................... 501/103; 216/109

(58) Field of Search ................................ 501/103, 126, 501/134, 152; 216/96, 107, 109

(56) References Cited

U.S. PATENT DOCUMENTS 4,135,012 A * 1/1979 Su ............................ 427/309
4,318,770 A * 3/1982 Chakupurakal .............. 216/90
5,034,107 A * 7/1991 Wang et al. ................ 205/781
5,130,210 A * 7/1992 Iwasaki et al. ............... 429/33
5,691,594 A * 11/1997 Takeuchi et al. ............ 310/330
5,779,802 A * 7/1998 Borghs et al. ........ 118/723 MP
6,645,585 B2 * 11/2003 Ozono ....................... 428/34.4

OTHER PUBLICATIONS

Moulson et al., Electroceramics Material Properties Applications, pp. 156–160, 1990.*

* cited by examiner

*Primary Examiner*—David Sample
(74) *Attorney, Agent, or Firm*—Oblon, Spivak, McClelland, Maier & Neustadt, P.C.

(57) ABSTRACT

A plasma-resistant article is provided in which a surface region of the article to be exposed to plasma in a corrosive atmosphere is formed from a zirconia-based ceramic that contains yttria in an amount of 7 to 17 mol %. The plasma-resistant article exhibits a sufficient resistance against exposure to plasma and is cost-effective. Preferably, the surface region has a centerline average roughness (Ra) of 1.2 to 5.0 μm, which is readily achieved through the use of an etching solution containing hydrofluoric acid. The present invention also provides a production method for such a plasma-resistant article.

1 Claim, 1 Drawing Sheet

PLASMA-RESISTANT ARTICLES AND PRODUCTION METHOD THEREOF

BACKGROUND OF THE INVENTION

1. Field of the Invention

The present invention relates to plasma-resistant articles that exhibit improved plasma-resistance in a corrosive atmosphere of halogen gas. The present invention further relates to a method for producing such an article.

2. Description of the Related Art

Apparatuses for etching microscopic features onto a semiconductor wafer are used, for example, in the production process of semiconductor devices, as are sputtering apparatuses and CVD apparatuses for depositing film on a semiconductor wafer. These types of manufacturing apparatuses generally employ a plasma generator for the microscopic scale-processing required to make highly integrated devices. For example, helicon wave plasma etchers such as the one shown schematically in cross-section in the accompanying drawing are known.

In the drawing, reference numeral 1 denotes an etch-process chamber, which includes an etching gas inlet 2 and a vacuum exhaust port 3. Circumferentially arranged about the process chamber 1 are an antenna 4, an electromagnet 5, and a permanent magnet 6. A lower electrode 8 is arranged inside the process chamber 1 to hold a semiconductor wafer 7 serving as a workpiece. The antenna 4 is connected to a first RF power source 10 via a first matching network 9 while the lower electrode 8 is connected to a second RF power source 12 via a second matching network 11.

This etching apparatus operates in the following manner. First, the etch-process chamber 1 is evacuated to vacuum with the semiconductor wafer 7 placed on the lower electrode 8. Etching gas is then supplied through the etching gas inlet 2. Subsequently, an RF current with a frequency of for example 13.56 MHz is allowed to flow from the RF power sources 10 and 12 through the respective matching networks 9 and 11 to the antenna 4 and the lower electrode 8, respectively. In the meantime, a predetermined current is allowed to flow through the electromagnet 5 to generate a magnetic field and thus high-density plasma in the process chamber 1. The energy of the plasma is then utilized to cause the etching gas to dissociate into atoms, which in turn are used to etch film deposited on a surface of the semiconductor wafer 8.

Apparatuses of this type make use, as the etching gas, of chlorine-based gases, such as carbon tetrachloride ($CCl_4$) and boron chloride ($BCl_3$), as well as of fluorine-based gases, such as fluorocarbons (e.g., $CF_4$ and $C_4F_8$), nitrogen fluoride ($NF_3$) and sulfur fluoride ($SF_6$), each of which is known to be a corrosive gas. Thus, structural members, including inner walls of the process chamber 1, monitor windows, windows for introducing microwave, the lower electrode 8 and susceptors, that are to be exposed to plasma in an atmosphere of the corrosive gas must have an adequate plasma-resistance. To meet this requirement, materials such as alumina ceramics, sapphire, silicon nitride ceramics and aluminum nitride ceramics are used in the plasma-resistant members.

However, such plasma-resistant members, made from the aforementioned materials including alumina ceramics, sapphire, silicon nitride ceramics, and aluminum nitride ceramics, gradually corrode when exposed to plasma in a corrosive atmosphere. As a result, crystal particles forming surfaces may fall off the surfaces and the materials may react with fluorine to form aluminum fluoride, giving rise to the problem of particle contamination. The particles that have come off the surfaces attach to the semiconductor wafer 7, the lower electrode 8, and/or the adjacent area of the lower electrode 8 so as to adversely affect the precision of the etching process. As a result, the performance of the semiconductor is lowered, as is its reliability.

Corrosion-resistance is also required for CVD apparatuses, which are to be exposed to nitrogen fluoride and other fluorine-based gases in the presence of plasma during cleaning of the apparatus.

To provide the required degree of corrosion-resistance, plasma-resistant articles have been proposed that are made from an yttrium aluminate garnet (generally known as YAG) ceramic (examples are described in Japanese Patent Laid-Open publications No. Hei 10-45461 and No. Hei 10-236871). Despite their relatively high plasma-resistance as compared to alumina, use of the yttrium aluminate garnet-based ceramics tends to result in low yields when it is desired to apply microetching as in the case of forming microscopic circuit patterns. Furthermore, use of these materials adds to cost. For these reasons, a demand exists for cost effective materials that have high plasma resistance.

Stabilized zirconia ceramics that abundantly contain yttria have attracted attention in terms of cost reduction. That is, not only do the yttria-stabilized zirconia-based ceramics exhibit a plasma resistance 5 times or higher than that of alumina, but they also are less expensive than the yttrium alminate garnet ceramics and are thus expected to be advantageous in cost reduction.

The walls of the etch process chamber 1 are typically made of materials such as alumina ceramics, alumite and aluminum, so that aluminum fluoride by-products are formed during the plasma etching process involving the use of halogen gases and are deposited on the surfaces of structural members within the chamber, forming a layer there. Such a layer of aluminum fluoride may come off the surfaces to provide a source of dust. For this reason, not to mention the high plasma resistance, the structural members within the chamber must have the ability to suppress or prevent peeling of the dust-causing aluminum fluoride deposits.

To this end, surfaces of the plasma-resistant ceramics formed of yttria-stabilized zirconia-based materials are sandblasted to impart a roughness to prevent the aluminum fluoride deposits from coming off. However, treating the surfaces using the sandblast technique to impart surface roughness can damage the treated surfaces due to formation of microcracks and contamination of ceramic surfaces. Thus, this approach is not effective in preventing dust formation and contamination of the semiconductor devices.

SUMMARY OF THE INVENTION

The present invention has been devised in view of the above-described current state of the art and its objectives are to provide cost effective plasma-resistant articles that are sufficiently durable against exposure to plasma and to provide a method for producing such plasma-resistant articles.

Accordingly, the invention according to claim 1 is a plasma-resistant article, which is characterized in that a zirconia-based ceramic containing yttria in an amount of 7 to 17 mol % is formed over at least a surface region of the plasma-resistant article to be exposed to plasma in a corrosive atmosphere.

The invention according to claim 2 is characterized in that the surface of the zirconia-based ceramic of the plasma-resistant article according to claim 1 has a centerline average roughness (Ra) of 1.2 to 5.0 μm.

The invention according to claim 3 is a method for producing a plasma-resistant article. The method includes the steps of providing a ceramic article comprising of a zirconia-based ceramic containing 7 to 17 mol % of yttria formed over at least a surface region of the plasma-resistant article that is exposed to plasma in a corrosive atmosphere; and treating the ceramic article with an etching solution containing hydrofluoric acid to impart to the surface of the zirconia-based ceramic a centerline average roughness (Ra) of 1.2 to 5.0 μm.

The invention of claims 1 to 3 has been completed based on the following findings, which were made through the course of various analyses of zirconia-based ceramics containing yttria ($Y_2O_3$) components:

(a) An yttria-zirconia solid solution ceramic containing the yttria component at a ratio in the range of 7 to 17 mol % can exhibit an excellent plasma-resistance.

(b) It is sufficient that the yttria-zirconia solid solution ceramic with the above-described composition cover at least a surface region to be exposed to plasma.

(c) Containing a small fraction of the yttria component, the zirconia-based ceramic article can serve as a low-cost plasma-resistant article.

(d) The zirconia-based ceramic article also has a high mechanical strength and thermal stability and thus is less susceptible to damage when handled.

(e) The yttria-zirconia solid solution ceramic article for forming a surface region to be exposed to plasma exhibits an excellent anti-peeling property and film deposits are less susceptible to peeling when its surface has a centerline average roughness (Ra) of 1.2 to 5.0 μm.

The reason that the yttria-zirconia solid solution ceramic exhibits high plasma-resistance is believed to be as follows: $ZrF_3$, which is produced when zirconia reacts with fluorine, has less tendency to evaporate and a higher plasma-resistance than does $AlF_3$, which is produced when aluminum reacts with fluorine in the plasma. Moreover, $YF_3$, produced when the added yttria reacts with fluorine in the plasma, enhances the plasma-resistance. Since the ratio of the added yttria component is relatively small, reduction of strength and fracture toughness is avoided, as is an increase in costs.

As for the invention of claims 1 to 3, the amount of yttria in the yttria-zirconia ceramic for forming a surface region to be exposed to plasma is chosen to fall within the range of 7 to 17 mol %. The amount of yttria less than 7 mol % will result in an insufficient plasma corrosion-resistance and anti-peeling property although crystal structures in the zirconia-based ceramic can be stabilized. In comparison, the amount of yttria exceeding 17 mol % leads not only to an increase in costs but also to a reduced strength and fracture toughness. The average crystal size of the zirconia-based ceramic is preferably in the range of about 0.5 to about 40 μm.

As for the invention of claims 1 to 3, it is preferred that the surface region to be exposed to plasma in the corrosive atmosphere be conditioned in the following manner: The surface of the yttria-zirconia ceramic for forming the surface region preferably has a centerline average roughness (Ra) of 1.2 to 5.0 μm. When the centerline average roughness (Ra) falls within the range of 1.2 to 5.0 μm, particle contamination and dust formation, which result from deposition, peeling, or coming off of the by-products of the plasma reaction (e.g., aluminum fluoride), can be prevented in a even more effective manner.

The plasma-resistant article according to claim 1 can be manufactured in the following manner: For example, to a powder material composed mostly of zirconia particles with the average particle size of 0.1 to 1.0 μm, an amount of yttrium chloride, yttrium nitrate ($Y(NO_3)_3$), or other yttrium compounds that is equivalent to 7 to 17% (in molar ratio) of yttria is added. The resulting composition is then heat-treated at temperatures of about 700 to 1100° C. to form an yttria-zirconia solid solution system, which then is crushed to make a powder material.

Subsequently, a binder resin to serve as a molding auxiliary agent is added, along with a solvent, to the powder material, and the mixture is mixed and stirred in, for example, a rotary ball mill to form a slurry. The slurry is then formed into granules by using, for example, the spray dryer technique and the granules are shaped by using, for example, the hydrostatic pressure press technique. The powder material may be shaped by using other molding techniques other than the hydrostatic pressure press, including molding with metal molds, extrusion molding, injection molding, and casting.

Subsequently, the molded products are sintered at temperatures of 1450 to 1700° C. The sintering temperature lower than 1450° C. may result in insufficiently sintered products, whereas desired ceramic articles may not be obtained due to the growth of crystals and the changes in the property of the solid solution system when the sintering temperature is higher than 1700° C. The atmosphere for use in sintering may be the atmosphere (or air), reductive atmosphere, vacuum or any other atmosphere suitable for this purpose. The sintering process may be followed by annealing in the atmosphere. The ceramic articles with a low porosity can be obtained by sintering the molded products under pressure using techniques including hot isostatic press and hot-press techniques.

A better anti-peeling property can be readily obtained by using the invention/means in accordance with claim 3. That is, a centerline average roughness (Ra) of 1.2 to 5.0 μm can be achieved by immersing the yttria-zirconia ceramic articles in a previously prepared etching solution having a hydrofluoric acid concentration of about 4 to about 49% for 5 to 60 minutes.

According to the invention of claim 1 or 2, as the yttria forming the region to be exposed to plasma becomes a solid solution, the zirconia-based ceramic articles not only stabilize in terms of its crystal structure but also acquire improved plasma resistance. The small reactivity that results from the improvement in the plasma resistance effectively eliminates the possibility of particle contamination when the ceramic articles are used in the region to be exposed to the dense, corrosive plasma. This makes the ceramic articles suitable for high-precision, reliable machining.

Accordingly, the ceramic articles of the present invention effectively contribute to the manufacturing/processing of reliable, high-performance semiconductors without adversely affecting the quality and precision of the film deposits while at the same time avoiding increases in the manufacturing cost of apparatuses and semiconductors.

The invention of claim 3 makes it possible to mass-produce low-cost, plasma-resistant articles with further improved plasma-resistance at high yields.

BRIEF DESCRIPTION OF THE DRAWINGS

The accompanying drawing is a cross-sectional view schematically showing a construction of a plasma etching apparatus.

DETAILED DESCRIPTION OF THE PREFERRED EMBODIMENTS

Figure 1:
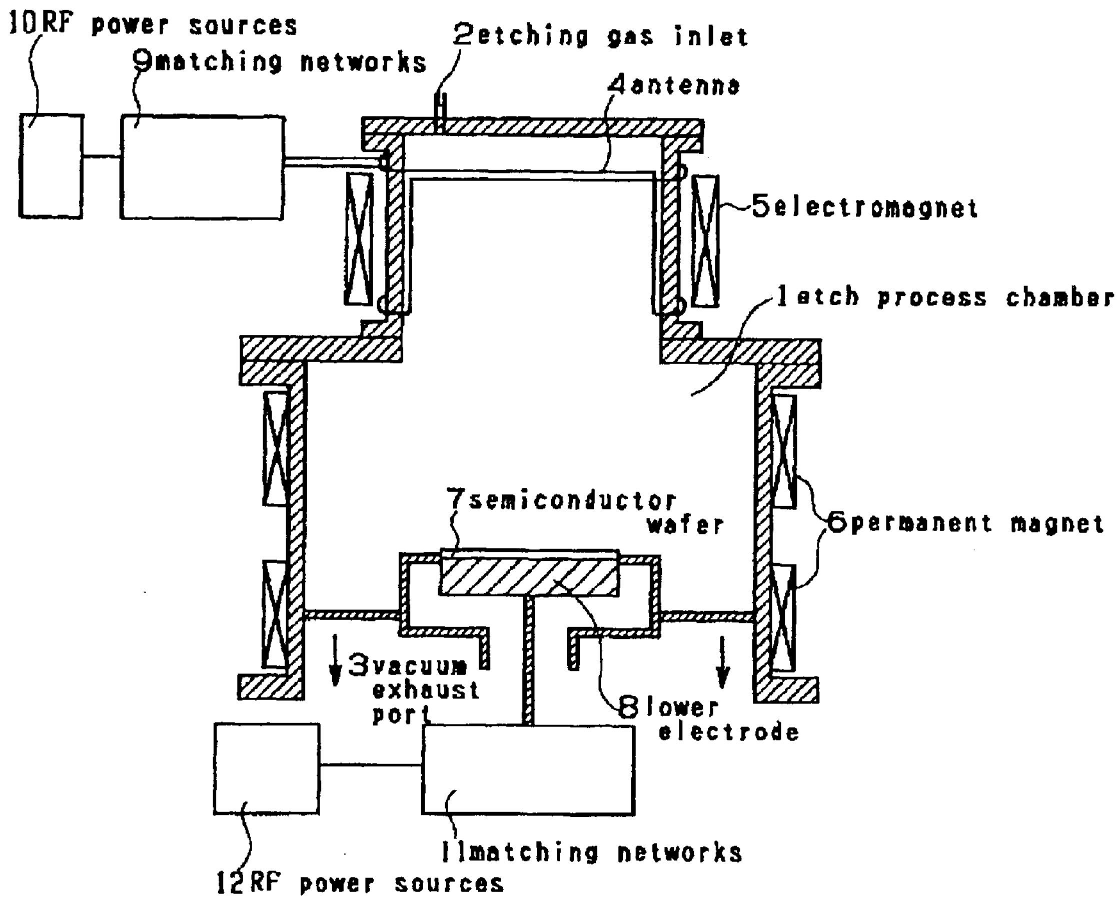

The present invention will now be described in the following with reference to examples.

To 100% by weight of zirconia particles with the purity of 99.5% and average particle size of 1.0 μm, an amount of yttrium chloride equivalent to 8% yttria (in molar ratio) was added to prepare a composition. The composition was then heat-treated at 850° C. in the atmosphere to establish yttria-zirconia solid solution system, which was crushed to obtain a powder material.

To the powder material, a trace amount of a molding auxiliary agent (e.g., magnesia) was added along with proper amounts of ion-exchanged water and polyvinyl alcohol. The mixture was stirred and mixed to form a slurry, which in turn was formed into granules by means of a spray dryer. Using metal molds, the resultant granules were molded at a pressure of 100 Mpa into a molded product with a thickness of 15 mm and an outer diameter of 300 mm.

The molded product was calcined and degreased at 900° C. and was subsequently sintered at 1550° C. in the atmosphere to obtain an yttria-zirconia solid solution ceramic article that was substantially uniform in composition in its entirety. The ceramic article had a surface porosity of less than 0.1% and had a centerline average roughness Ra of about 0.3 to about 1.0 μm.

The ceramic article was machined with a diamond grindstone into a ceramic ring (Sample 1) that was 10 mm thick and had an inner diameter of 200 mm and an outer diameter of 250 mm. At the same time, three ceramic rings equivalent to Sample 1 were each immersed in a 10% solution of hydrofluoric acid (etching solution) for 5 to 20 minutes for etching so that the rings had centerline average roughnesses of 1.2 to 5.0 μm (Samples 2, 3 and 4).

As comparative examples, another three ceramic rings were prepared in the same manner as described above except that the amount of yttrium chloride used was equivalent to 25% yttria (in molar ratio) and one ring was ground to have a centerline average roughness Ra of 0.6 μm (Comparative Example 1), while the other two were sandblasted to have respective centerline average roughnesses of 2.0 μm (Comparative Example 2) and 5.0 μm (Comparative Example 3).

Each of the ceramic rings of Samples 1 to 4 and Comparative Examples 1 to 3 was mounted on a parallel-plated RIE apparatus to serve as the susceptor, and the plasma exposure test was conducted under the following conditions: frequency=13.56 MHz; RF source power=500W; RF source bias=300W; $CF_4/CHF_3/Ar$=30:30:600; and gas pressure=500 mTorr. Specifically, the test was conducted in the following manner. Each ceramic ring was mounted on the apparatus to serve as the susceptor for holding an 8-inch semiconductor wafer. The wafer was replaced every 3 minutes and was sampled every 1 hour. The number of particles sized 0.2 μm or larger that attached to each wafer was counted. The results are shown in Table 1. Note that Table 1 shows the length of addition time that it took before the number of the particles sized 0.2 μm or larger attached to a wafer first exceeded 30.

TABLE 1

| Samples | Surface treatment | Surface roughness Ra (μm) | Addition Time (hrs) |
|---|---|---|---|
| Sample 1 | Untreated | 1.0 | 15 |
| Sample 2 | Etched in HF solution | 1.2 | 25 |
| Sample 3 | Etched in HF solution | 2.0 | 30 |
| Sample 4 | Etched in HF solution | 5.0 | 30 |
| Comp. Ex. 1 | Ground | 0.6 | 5 |
| Comp. Ex. 2 | Sandblasted | 2.0 | 10 |
| Comp. Ex. 3 | Sandblasted | 5.0 | 10 |

As can be seen from Table 1, each of the plasma-resistant articles of Examples is significantly less susceptible to damage or particle contamination caused by plasma in the corrosive atmosphere and is less likely to produce dust than the plasma-resistant articles of Comparative Examples. Thus, not only does the plasma-resistant article of the present invention ensure processing with high precision, but it also effectively eliminates the possibility that workpieces can be affected adversely. Formation of surface microcracks and surface contamination were also observed in each of Comparative Examples.

It should be appreciated to those of ordinary skills in the art that the present invention is not limited to the above-described embodiments and various changes and modifications may be made without departing from the spirit of the invention. For example, a construction can be conceived of in which parts (substrates) that are not exposed to plasma are made of zirconia and a surface layer is made of zirconia-based ceramic containing yttria. Also, means for molding, temperatures for calcining/degreasing, and conditions for sintering may be properly varied within acceptable ranges.

According to the invention of claim 1 or 2, a plasma-resistant article is provided that is made of a zirconia ceramic, which has been made as a solid solution system of yttria and zirconia and thus has a high plasma-resistance. Improved plasma-resistance not only reduces the reactivity of the articles but also prevents peeling or coming off of, thus subsequent attachment of, deposits and particles.

Accordingly, use of the plasma-resistant articles of the present invention in the region to be exposed to dense, corrosive plasma significantly reduces the possibility of particle contamination and dust formation, thereby providing reliable high-precision structural members suitable for processing. The plasma-resistant articles of the present invention effectively contribute to improving manufacturing processes of reliable, high-performance semiconductors without adversely affecting the quality and precision of film deposits while at the same time preventing an increase in the manufacturing costs of production apparatuses and semiconductors. According to the invention of claim 1, the plasma-resistance is further improved and the possibility of particle contamination and dust formation is significantly reduced, enabling mass-production of the plasma-resistant articles at high yield. In this manner, production of reliable semiconductors is facilitated.

What is claimed is:

1. A method for producing a plasma-resistant article, comprising the steps of:

providing a ceramic article comprising of a zirconia-based ceramic containing 7 to 17 mol % of yttria formed over at least a surface region of the plasma-resistant article to be exposed to plasma in a corrosive atmosphere; and treating the ceramic article with an etching solution containing hydrofluoric acid to impart to the surface of the zirconia-based ceramic a centerline average roughness (Ra) of 1.2 to 5.0 μm.

* * * * *